US012698212B2

(12) United States Patent
Yun et al.

(10) Patent No.: US 12,698,212 B2
(45) Date of Patent: Aug. 4, 2026

(54) METHOD FOR FABRICATING TRIHALODISILANE AND METHOD FOR FABRICATING SEMICONDUCTOR DEVICE USING THE SAME

(71) Applicant: SAMSUNG ELECTRONICS CO., LTD., Suwon-si (KR)

(72) Inventors: Ji Eun Yun, Busan (KR); Byung Keun Hwang, Seongnam-si (KR); Min Soo Kang, Sejong-si (KR); Sheby Mary George, Cheongju-si (KR); Woo Ri Bae, Yongin-si (KR); Sun Hye Hwang, Hwaseong-si (KR); Seong Tae Oh, Suwon-si (KR); Byeong Ok Cho, Cheongju-si (KR)

(73) Assignees: SAMSUNG ELECTRONICS CO., LTD.; WONIK Materials Co., Ltd.

( * ) Notice: Subject to any disclaimer, the term of this patent is extended or adjusted under 35 U.S.C. 154(b) by 796 days.

(21) Appl. No.: 18/100,629

(22) Filed: Jan. 24, 2023

(65) Prior Publication Data

US 2023/0264963 A1 Aug. 24, 2023

(30) Foreign Application Priority Data

Feb. 22, 2022 (KR) ........................ 10-2022-0022761

(51) Int. Cl.
*C01B 33/107* (2006.01)
*H10P 14/60* (2026.01)

(52) U.S. Cl.
CPC .. *C01B 33/10773* (2013.01); *C01B 33/10778* (2013.01); *H10P 14/6682* (2026.01)

(58) Field of Classification Search
CPC ........ C01B 33/10773; C01B 33/10778; H01L 21/02211
See application file for complete search history.

(56) References Cited

U.S. PATENT DOCUMENTS 8,975,429 B2 3/2015 Elangovan et al.
11,142,462 B2 10/2021 Hwang et al.
(Continued)

FOREIGN PATENT DOCUMENTS

KR 10-2020-0019721 A 2/2020
WO WO 2019/067139 A1 4/2019

*Primary Examiner* — Richard M Rump
(74) *Attorney, Agent, or Firm* — Muir Patent Law, PLLC

(57) ABSTRACT

A method for fabricating trihalodisilane, the method includes providing a halodisilane including at least four halogen atoms; reducing the halodisilane, using a mixed reducing agent including a first reducing agent represented by following Chemical Formula 1-1, in which $R_A$ is an alkyl group, and m and n are each independently 1 or 2, and m+n=3, and a second reducing agent represented by following Chemical Formula 2-1, in which $R_S$ is an alkyl group or an aryl group, p and q are each independently 1, 2, or 3, and p+q=4; and obtaining a product including a 1,1,1-trihalodisilane,

[Chemical Formula 1-1]

$$(R_A)_m\text{—Al—}H_n$$

[Chemical Formula 2-1]

$$(R_S)_p\text{—Sn—}H_q.$$

20 Claims, 16 Drawing Sheets

(56) References Cited

U.S. PATENT DOCUMENTS

| | | | | |
|---|---|---|---|---|
| 12,264,074 | B2 * | 4/2025 | Millward | C07F 7/025 |
| 2014/0012029 | A1 | 1/2014 | Abe et al. | |
| 2020/0369527 | A1 | 11/2020 | Ketola et al. | |
| 2021/0101918 | A1 | 4/2021 | Hwang et al. | |

* cited by examiner

METHOD FOR FABRICATING TRIHALODISILANE AND METHOD FOR FABRICATING SEMICONDUCTOR DEVICE USING THE SAME

CROSS-REFERENCE TO RELATED APPLICATION

This application claims priority from Korean Patent Application No. 10-2022-0022761 filed on Feb. 22, 2022, in the Korean Intellectual Property Office, and all the benefits accruing therefrom under 35 U.S.C. 119, the contents of which in its entirety are herein incorporated by reference.

BACKGROUND

1. Field

Embodiments relate to a method for fabricating trihalodisilane and a method for fabricating a semiconductor device using the same.

2. Description of the Related Art

Silane compounds are compounds used in an electronic industry, and especially may be used as silicon precursors for forming a silicon-containing layer on a substrate. Among the silane compounds, trihalodisilane may be an excellent silicon precursor.

To fabricate trihalodisilane, (1) a high-temperature coupling reaction between silane ($SiH_4$) and a tetrahalosilane (e.g., $SiCl_4$), (2) a halogenation reaction of disilane ($Si_2H_6$), (3) a partial reduction reaction of a hexahalodisilane (e.g., $Si_2Cl_6$) using a reducing agent such as a metal hydride or the like may be used.

SUMMARY

The embodiments may be realized by providing a method for fabricating trihalodisilane, the method including providing a halodisilane including at least four halogen atoms; reducing the halodisilane, using a mixed reducing agent including a first reducing agent represented by following Chemical Formula 1-1 and a second reducing agent represented by following Chemical Formula 2-1; and obtaining a product including a 1,1,1-trihalodisilane,

[Chemical Formula 1-1]

$$(R_A)_m—Al—H_n$$

wherein, in Chemical Formula 1-1, $R_A$ is an alkyl group, and m and n are each independently 1 or 2, and m+n=3,

[Chemical Formula 2-1]

$$(R_S)_p—Sn—H_q$$

wherein, in Chemical Formula 2-1, $R_S$ is an alkyl group or an aryl group, p and q are each independently 1, 2, or 3, and p+q=4.

The embodiments may be realized by providing a method for fabricating trihalodisilane, the method including providing a halodisilane including at least four halogen atoms; cooling the halodisilane to a first temperature that is higher than a freezing point of the halodisilane and lower than 15° C.; mixing the cooled halodisilane with a mixed reducing agent including an aluminum reducing agent and a tin reducing agent to generate a mixture; stirring the mixture at a second temperature that is higher than the first temperature; and separating a 1,1,1-trihalodisilane from the mixture.

The embodiments may be realized by providing a method for fabricating a semiconductor device, the method including providing a substrate; and forming a silicon-containing layer on the substrate by providing a silicon precursor including a halodisilane including at least four halogen atoms, and reducing the halodisilane using a mixed reducing agent including an aluminum reducing agent and a tin reducing agent.

BRIEF DESCRIPTION OF THE DRAWINGS

Features will be apparent to those of skill in the art by describing in detail exemplary embodiments with reference to the attached drawings in which.

DETAILED DESCRIPTION

Hereinafter, a method for fabricating trihalodisilane according to exemplary embodiments will be described referring to FIGS. 1 to 6.

Figure 1:
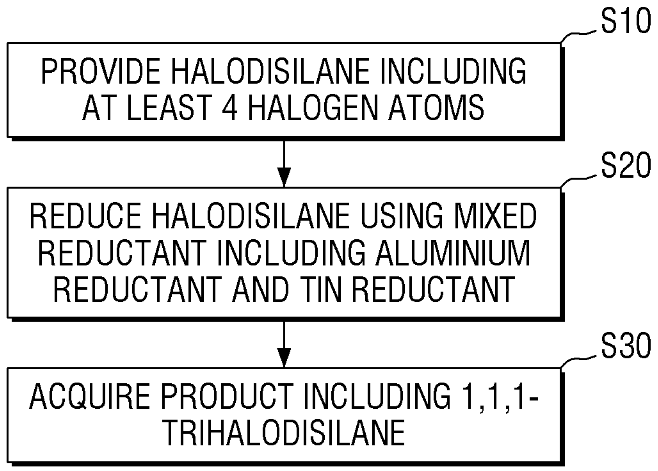
FIG. 1 is a flowchart for explaining the method for fabricating trihalodisilane according to some embodiments.

FIG. 1 is a flowchart for explaining the method for fabricating trihalodisilane according to some embodiments.

Referring to FIG. 1, the method for fabricating trihalodisilane according to some embodiments may include, e.g., providing a halodisilane including at least four halogen atoms (S10), reducing the halodisilane by the use of a mixed reducing agent including an aluminum (e.g., aluminum-containing) reducing agent and a tin (e.g., tin-containing) reducing agent (S20), and obtaining a product including 1,1,1-trihalodisilane (S30).

The halodisilane including at least four halogen atoms may include, e.g., tetrahalodisilane, pentahalodisilane, or hexahalodisilane. In an implementation, the halodisilane may include, e.g., a hexahalodisilane. In an implementation, the halodisilane may include, e.g., hexachlorodisilane ($Si_2Cl_6$). As used herein, the term "or" is not an exclusive term, e.g., "A or B" would include A, B, or A and B.

The halogen atom may include, e.g., fluorine (F), chlorine (Cl), bromine (Br), or iodine (I). In an implementation, the halogen atom may include chlorine (Cl). In an implementation, the halodisilane may include hexachlorodisilane ($Si_2Cl_6$).

The aluminum reducing agent included in the mixed reducing agent may include, e.g., an aluminum hydride, such as lithium aluminum hydride, alkylaluminium hydride, or sodium bis(2-methoxyethoxy)aluminum hydride. The aluminum reducing agent may be used alone or in combination of two or more types. In the following description, the aluminum reducing agent may also be referred to as a first reducing agent.

In an implementation, the first reducing agent may include, e.g., an alkylaluminum hydride represented by Chemical Formula 1-1 below.

[Chemical Formula 1-1]

$$(R_A)_m\text{—Al—}H_n$$

In Chemical Formula 1-1, m and n may each independently be, e.g., 1 or 2, and m+n=3.

In Chemical Formula 1-1, $R_A$ may be, e.g., an (unsubstituted or substituted) alkyl group. In an implementation, $R_A$ may be, e.g., an alkyl group having carbon atoms of 1 to 10. The alkyl group having carbon atoms of 1 to 10 may include, e.g., a methyl group, an ethyl group, a propyl group, a butyl group, a pentyl group, a hexyl group, a heptyl group, an octyl group, a nonyl group, a decyl group, or an isomer thereof. In an implementation, $R_A$ may be, e.g., an isobutyl group.

In an implementation, in Chemical Formula 1-1, m may be 2 and n may be 1. In an implementation, the first reducing agent may be represented by the following Chemical Formula 1-2.

[Chemical formula 1-2]

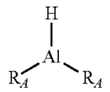

In an implementation, the first reducing agent may include, e.g., diisobutylaluminium hydride (DIBAL-H).

The tin reducing agent included in the mixed reducing agent may include, e.g., a tin hydride such as alkyltin hydride. The tin reducing agent may be used alone or in combination of two or more types. In the following description, the tin reducing agent may also be referred to as a second reducing agent.

In an implementation, the second reducing agent may include, e.g., an alkyltin hydride represented by Chemical Formula 2-1 below.

[Chemical Formula 2-1]

$$(R_S)_p\text{—Sn—}H_q$$

In Chemical Formula 2-1, p and q may each independently be a natural number of 1 to 3 (e.g., 1, 2, or 3), and p+q=4.

In Chemical Formula 2-1, $R_S$ may be, e.g., an (unsubstituted or substituted) alkyl group or an (unsubstituted or substituted) aryl group. In an implementation, $R_S$ may be, e.g., an alkyl group having carbon atoms of 1 to 10, an aryl group having carbon atoms of 6 to 18, an arylalkyl group having carbon atoms of 6 to 18, or an alkylaryl group having carbon atoms of 6 to 18. The alkyl group having carbon atoms of 1 to 10 may include, e.g., a methyl group, an ethyl group, a propyl group, a butyl group, a pentyl group, a hexyl group, a heptyl group, an octyl group, a nonyl group, a decyl group, or an isomer thereof. The aryl group having carbon atoms of 6 to 18 may include, e.g., a phenyl group, a naphthyl group, or the like. The arylalkyl group having carbon atoms of 6 to 18 may include, e.g., a benzyl group, a phenethyl group, or the like. The alkylaryl group having carbon atoms of 6 to 18 may include, e.g., a methylphenyl group, an ethylphenyl group, or the like. In an implementation, $R_S$ may be, e.g., an n-butyl group or a phenyl group.

In an implementation, in Chemical Formula 2-1, p may be 3 and q may be 1. In an implementation, the second reducing agent may be, e.g., represented by following Chemical Formula 2-2.

[Chemical Formula 2-2]

In an implementation, the second reducing agent may include, e.g., tri-n-butyltin hydride ($nBu_3Sn$—H) or triphenyltin hydride ($Ph_3Sn$—H).

An amount of the mixed reducing agent used for reducing the halodisilane may be appropriately adjusted in consideration of productivity, economy and the like. In an implementation, a molar ratio of the halodisilane to the mixed reducing agent may be, e.g., from about 1:0.5 to about 1:5. In an implementation, the molar ratio of the halodisilane to the mixed reducing agent may be, e.g., from 1:0.5 to about 1:3. In an implementation, the molar ratio of the halodisilane to the mixed reducing agent may be, e.g., from about 1:1 to about 1:2.5.

In the mixed reducing agent, a content ratio (molar ratio) of the first reducing agent to the second reducing agent may be, e.g., about 9.5:0.5 to about 0.5:9.5. Within the aforementioned range, the mixed reducing agent may help effectively reduce generation of by-products (e.g., dihalodisilane and tetrahalodisilane) in a partial reduction reaction of halodisilane. In an implementation, in the mixed reducing agent, the molar ratio of the first reducing agent to the second reducing agent may be, e.g., from about 9:1 to about 1:9. In an implementation, in the mixed reducing agent, the molar ratio of the first reducing agent to the second reducing agent may be, e.g., about 9:1 to about 5:5.

The 1,1,1-trihalodisilane included in the product may include, e.g., 1,1,1-trifluorodisilane, 1,1,1-trichlorodisilane, 1,1,1-tribromodisilane, or 1,1,1-triiododisilane.

The 1,1,1-trihalodisilane may be fabricated by a partial reduction reaction of halodisilane using the mixed reducing agent. In an implementation, at least a part among at least four halogen atoms of the halodisilane may be replaced with hydrogen atoms by a partial reduction reaction using the mixed reducing agent. In an implementation, when the halodisilane includes hexachlorodisilane ($Si_2Cl_6$), the 1,1,1-trihalodisilane may include 1,1,1-trichlorodisilane.

In an implementation, the product may further include a pentahalodisilane. The pentahalodisilane may include, e.g., pentafluorodisilane, pentachlorodisilane, pentabromodisilane, or pentaiododisilane. In an implementation, when the halodisilane includes hexachlorodisilane ($Si_2Cl_6$), the pentahalodisilane may include pentachlorodisilane.

The method for fabricating trihalodisilane according to some embodiments may not use a separate solvent other than the above-mentioned mixed reducing agent used as the reducing agent. Therefore, the method for fabricating trihalodisilane according to some embodiments may be easy to purify 1,1,1-trihalodisilane and has an improved yield, e.g., as compared with other methods that use a solvent.

Figure 2:
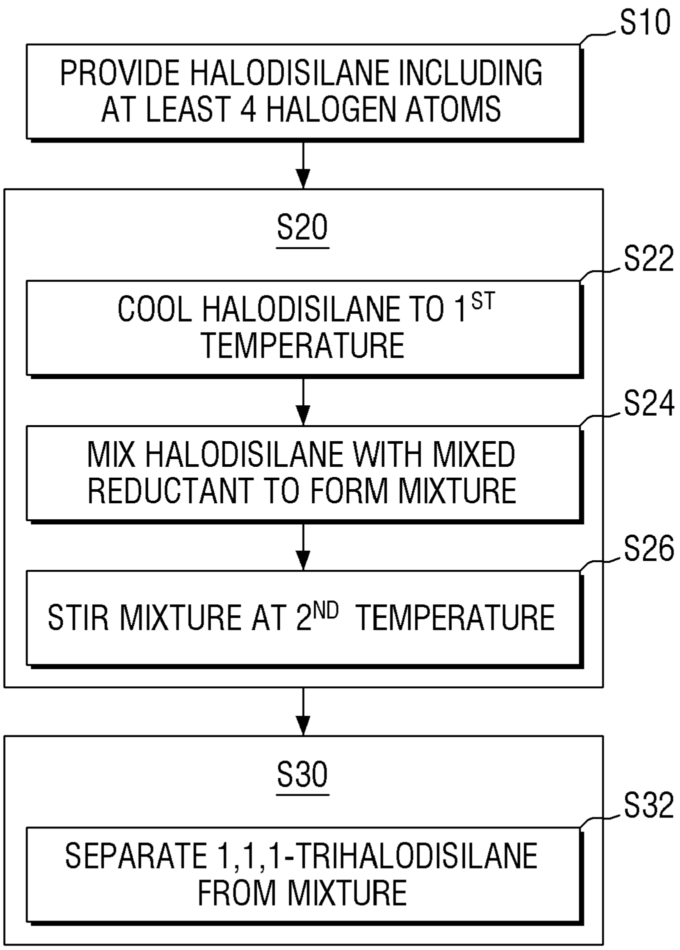
FIGS. 2 to 4 are various exemplary flowcharts for explaining a method for fabricating trihalodisilane according to some embodiments.
Figure 3:
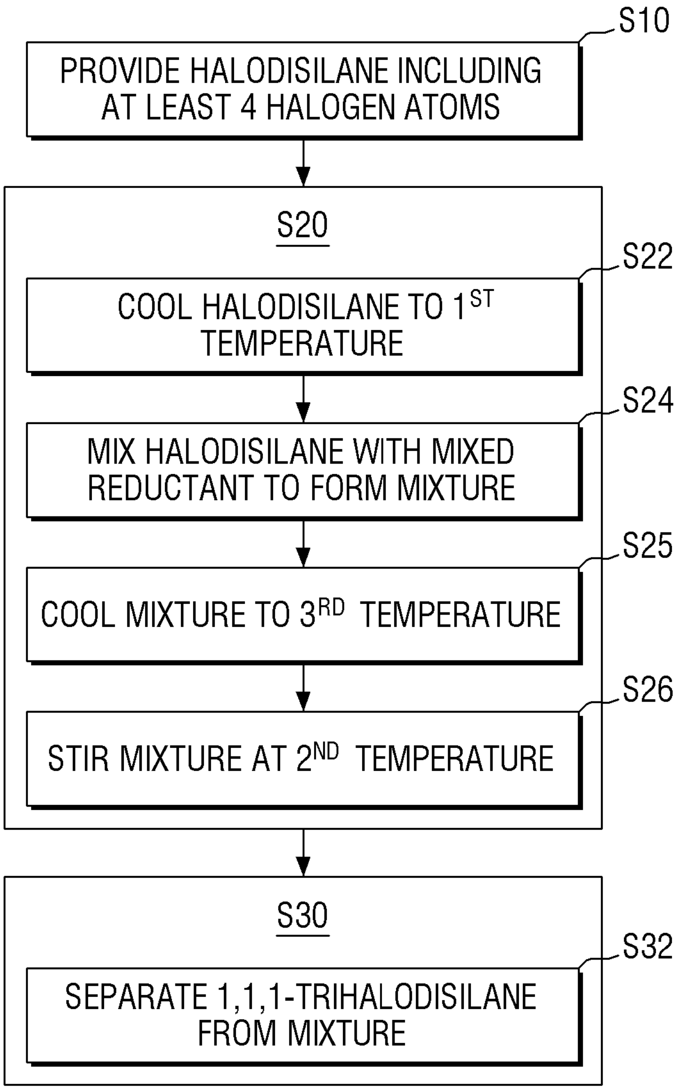
Figure 4:
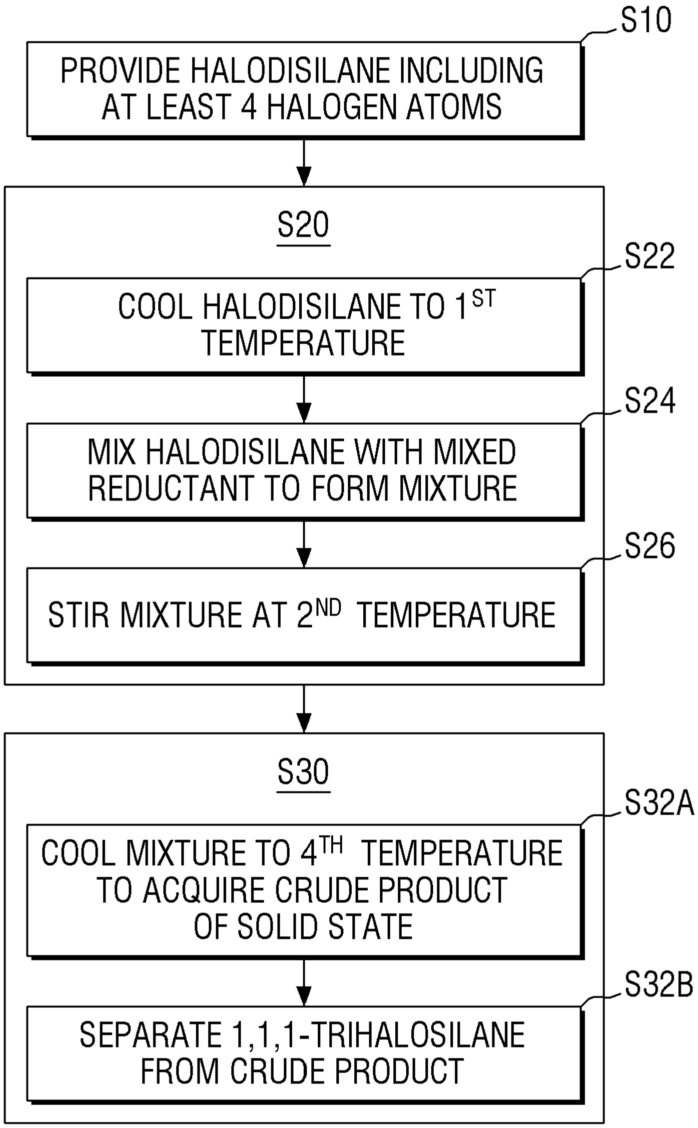

FIGS. 2 to 4 are various exemplary flowcharts for explaining a method for fabricating trihalodisilane according to some embodiments. For convenience of explanation, repeated parts of contents explained above using FIG. 1 may be briefly described or omitted.

Referring to FIG. 2, in the method for fabricating trihalodisilane according to some embodiments, reducing the halodisilane using the mixed reducing agent (S20) may include cooling the halodisilane to a first temperature (S22), mixing the mixed reducing agent with the cooled halodisilane to form a mixture (S24), and stirring the mixture at a second temperature (S26).

In the cooling of the halodisilane (S22), the first temperature may be lower than room temperature (e.g., about 15° C. to about 25° C.). In an implementation, the first temperature may be about 15° C. or lower. As the halodisilane is cooled to a temperature lower than room temperature, the reactivity may be adjusted in the mixing the mixed reducing agent with the halodisilane (S24), and generation of by-products (e.g., dihalodisilane or tetrahalodisilane) may be reduced. In an implementation, the first temperature may be about 10° C. or lower.

In an implementation, in the cooling of the halodisilane (S22), the first temperature may be higher than a freezing point of the halodisilane. In an implementation, when the halodisilane includes hexachlorodisilane ($Si_2Cl_6$), the first temperature may be about 0° C. or higher. This makes it possible to provide a liquid-phase halodisilane. In an implementation, the first temperature may be about 5° C. or higher.

In the forming of the mixture (S24), the mixed reducing agent may include the first reducing agent (aluminum reducing agent), and the second reducing agent (tin reducing agent). As the mixed reducing agent is mixed with the halodisilane, the partial reduction reaction of the halodisilane may be performed. The 1,1,1-trihalodisilane may be generated in the mixture accordingly.

In the stirring of the mixture (S26), the second temperature may be higher than the first temperature. In an implementation, the second temperature may be room temperature, e.g., 15° C. to 25° C. In an implementation, the mixture may be heated to room temperature and then stirred. As the mixture is stirred at the second temperature, higher than the first temperature, the partial reduction reaction of the halodisilane may be completed. The time of stirring the mixture may be, e.g., about 1 hour or more. In an implementation, the time of stirring the mixture may be about 3 hours or more.

In an implementation, the cooling of the halodisilane (S22), the forming the mixture (S24), and the stirring the mixture (S26) may all be performed at a normal (e.g., atmospheric) pressure. As a result, the method for fabricating trihalodisilane according to some embodiments may be superior in terms of productivity and economy, as compared with other methods performed under high temperature or high pressure conditions.

Referring to FIG. 2, in the method for fabricating trihalodisilane according to some embodiments, obtaining the product (S30) may include a step of separating the 1,1,1-trihalodisilane from the mixture (S32).

The separating of the 1,1,1-trihalodisilane from the mixture (S32) may be performed, e.g., by a fractional distillation. In an implementation, the 1,1,1-trihalodisilane may be separated from the mixture by a reduced pressure fractional distillation performed at, e.g., about 20 torr and about 60° C. In an implementation, separating the 1,1,1-trihalodisilane from the mixture (S32) may be performed by a variety of other suitable separation processes.

Referring to FIG. 3, in the method for fabricating trihalodisilane according to some embodiments, reducing the halodisilane using the mixed reducing agent (S20) may further include a step of cooling the mixture to a third temperature (S25).

In the cooling of the mixture (S25), the third temperature may be lower than the first temperature. In an implementation, the third temperature may be, e.g., about 0° C. or lower. As the mixed reducing agent is mixed with the cooled halodisilane, the mixture may be further cooled to a temperature lower than the freezing point of pure halodisilane. As the mixture is further cooled, the reactivity may be adjusted in the partial reduction reaction of the halodisilane, and generation of by-products (e.g., dihalodisilane and tetrahalodisilane) may be further reduced. In an implementation, the third temperature may be, e.g., about −5° C. or lower.

In an implementation, in the cooling of the mixture (S25), the third temperature may be adjusted so that the halodisilane in the mixture does not freeze. In an implementation, the third temperature may be, e.g., about −20° C. or higher. This makes it possible to provide the liquid-phase mixture. In an implementation, the third temperature may be, e.g., about −15° C. or higher.

The cooling of the mixture (S25) may be performed before stirring the mixture at the second temperature (S26). In an implementation, in the mixing of the mixed reducing agent with halodisilane to form the mixture (S24), the temperature of the mixture may be maintained at a third temperature lower than the first temperature.

Referring to FIG. 4, in the method for fabricating trihalodisilane according to some embodiments, obtaining the product (S30) may include cooling the mixture to a fourth temperature to obtain a solid-phase crude product (S32A), and separating the 1,1,1-trihalodisilane from the crude product (S32B).

In the obtaining of the crude product (S32A), the fourth temperature may be lower than the third temperature. In an implementation, the fourth temperature may be, e.g., about −50° C. or lower. As the mixture is cooled, the solid-phase crude product including 1,1,1-trihalodisilane may be generated from the mixture. In an implementation, the fourth temperature may be, e.g., about −70° C. or lower.

In the obtaining of the crude product (S32A), the fourth temperature may be higher than the freezing point of the first reducing agent or the freezing point of the second reducing agent. In an implementation, when the first reducing agent includes diisobutylaluminum hydride, the fourth temperature may be about −80° C. or higher. The solid-phase crude product may be selectively separated from the mixture accordingly.

The separating of the 1,1,1-trihalodisilane from the crude product (S32) may be performed, e.g., by a fractional distillation. In an implementation, the 1,1,1-trihalodisilane may be separated from the crude product by the reduced pressure fractional distillation performed, e.g., at about 20 torr and about 60° C. In an implementation, separating the 1,1,1-trihalodisilane from the crude product (S32B) may be performed by various other separation processes.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

Hereinafter, the method for fabricating a trihalodisilane according to exemplary embodiments will be described in more detail referring to the following examples, and FIGS. 5 and 6. However, these are merely exemplary.

Example 1

After removing air in a dried reactor using nitrogen, 283 g (1,053 mmol) of hexachlorodisilane was injected into the reactor using nitrogen pressurization, and the temperature of the reactor was cooled to 7° C., using a cooling bath. A mixed reducing agent of diisobutylaluminum hydride 74.84 g (526 mmol) and tri-n-butyltin hydride 153.17 g (526 mmol) was slowly dropped and stirred in the reactor using a dropping funnel, and the temperature of the reactor was further slowly cooled to −10° C., while being careful to prevent freezing of hexachlorodisilane. After dropping of the mixed reducing agent was completed, the cooling bath was removed, the temperature of the reactor was raised to ambient (e.g., room) temperature, and the mixture was further stirred for 3 hours.

A solid-phase crude product was then obtained from the reaction mixture using a vessel cooled to −78° C. A primary product 119 g including 1,1,1-trichlorodisilane was obtained, by performing the reduced pressure fractional distillation on the obtained crude product at 20 torr and about 60° C. As a result of GC (gas chromatography) analysis, the primary product included 1,1,1-trichlorodisilane (3CDS, 37.2%), hexachlorodisilane (HCDS, 62.5%) and trace amounts of disilane ($Si_2H_6$). The yield of the obtained 1,1,1-trichlorodisilane was about 76% on the basis of usage amount of the mixed reducing agent.

The aforementioned GC analysis was performed under the following conditions, using a GC device (Agilent 5977B) equipped with a Capillary Column (SUPELCO company, SPB-1; 30 m*0.25 mm*1.0 μm), and using a TCD (thermal conductivity detector) as a detector.

Carrier gas: He

Sample injection temperature: 175° C.

Detector temperature: 300° C.

Sample injection volume (0.2 μL)

Column temperature: 50 to 275° C.

Total branch time 19.167 min.

Next, by performing the fractional distillation at 75° C. to 90° C. using a Vigreux column, 1,1,1-trichlorodisilane 29 g (175 mmol) was obtained as a secondary product. On the basis of 1,1,1-trichlorodisilane included in the primary product, the yield of 1,1,1-trichlorodisilane obtained as a secondary product was about 65%.

Example 2

1,1,1-trichlorodisilane was obtained in the same manner as in Example 1, except that hexachlorodisilane 100 g (372 mmol) was used, and diisobutylaluminum hydride 66.117 g (465 mmol) and tri-n-butyltin hydride 135.31 g (465 mmol) were used as mixed reducing agents.

According to this example, a primary product 17.56 g including 1,1,1-trichlorodisilane was obtained. As a result of the GC analysis, the primary product included 1,1,1-trichlorodisilane (3CDS, 53.38%), hexachlorodisilane (HCDS, 46.5%) and a trace amount of disilane ($Si_2H_6$). The yield of the obtained 1,1,1-trichlorodisilane was about 18% on the basis of the usage amount of the mixed reducing agent.

Further, according to this example, 1,1,1-trichlorodisilane 5.7 g (35 mmol) was obtained as a secondary product. On the basis of 1,1,1-trichlorodisilane included in the primary product, the yield of 1,1,1-trichlorodisilane obtained as the secondary product was about 61%.

Example 3

1,1,1-trichlorodisilane was obtained in the same manner as in Example 1, except that hexachlorodisilane 50 g (186 mmol) was used, and diisobutylaluminium hydride 19.84 g (139 mmol) and tri-n-butyltin hydride 13.53 g (46 mmol) were used as the mixed reducing agent.

According to this example, a primary product 13.07 g including 1,1,1-trichlorodisilane was obtained. As a result of the GC analysis, the primary product included 1,1,1-trichlorodisilane (3CDS, 66.63%), hexachlorodisilane (HCDS, 33.3%) and a trace amount of disilane ($Si_2H_6$). The yield of the obtained 1,1,1-trichlorodisilane was about 85% on the basis of usage amount of the mixed reducing agent.

Furthermore, according to this example, 1,1,1-trichlorodisilane 5.4 g (33 mmol) was obtained as the secondary product. On the basis of 1,1,1-trichlorodisilane included in the primary product, the yield of 1,1,1-trichlorodisilane obtained as the secondary product was about 62%.

Example 4

1,1,1-trichlorodisilane was obtained in the same manner as in Example 1, except that hexachlorodisilane 50 g (186 mmol) was used, and diisobutylaluminium hydride 23.8 g (167 mmol) and tri-n-butyltin hydride 5.41 g (19 mmol) were used as the mixed reducing agent.

According to this example, a primary product 16.71 g including 1,1,1-trichlorodisilane was obtained. As a result of the GC analysis, the primary product included 1,1,1-trichlorodisilane (3CDS, 55.73%), pentachlorodisilane (SCDS, 4.4%), hexachlorodisilane (HCDS, 39.5%) and a trace amount of disilane ($Si_2H_6$). The yield of the obtained 1,1,1-trichlorodisilane was about 91% on the basis of the usage amount of the mixed reducing agent.

Furthermore, according to this example, 1,1,1-trichlorodisilane 5.7 g (33 mmol) was obtained as the secondary product. On the basis of 1,1,1-trichlorodisilane included in the primary product, the yield of 1,1,1-trichlorodisilane obtained as the secondary product was about 61%.

Example 5

1,1,1-trichlorodisilane was obtained in the same manner as in Example 1 except that hexachlorodisilane 300 g (1116 mmol) was used, and diisobutylaluminum hydride 285.63 g (2,008 mmol) and tri-n-butyltin hydride 64.95 g (223 mmol) were used as the mixed reducing agent.

According to this example, a primary product 203.44 g including 1,1,1-trichlorodisilane was obtained. As a result of the GC analysis, the primary product included 1,1,1-trichlorodisilane (3CDS, 58.36%), hexachlorodisilane (HCDS, 41.5%) and a trace amount of disilane ($Si_2H_6$). The yield of the obtained 1,1,1-trichlorodisilane was about 96% on the basis of the usage amount of the mixed reducing agent.

Moreover, according to this example, 1,1,1-trichlorodisilane 77.2 g (47 mmol) was obtained as the secondary product. On the basis of 1,1,1-trichlorodisilane included in the primary product, the yield of 1,1,1-trichlorodisilane obtained as the secondary product was about 65%.

Table 1 below shows the amounts of reactants used in Examples 1 to 5.

TABLE 1

| | $Si_2Cl_6$ (mmol) | Mixed reducing agent DIBAL-H (mmol) | Mixed reducing agent $nBu_3Sn$—H (mmol) | Molar ratio of $Si_2Cl_6$ to mixed reducing agent | Molar ratio of DIBAL-H to $nBu_3Sn$—H |
|---|---|---|---|---|---|
| Example 1 | 1,053 | 526 | 526 | 1:1 | 1:1 |
| Example 2 | 372 | 465 | 465 | 1:2.5 | 1:1 |
| Example 3 | 186 | 139 | 46 | 1:1 | 3:1 |
| Example 4 | 186 | 167 | 19 | 1:1 | 8.8:1 |
| Example 5 | 1,116 | 2,008 | 223 | 1:2 | 9:1 |

In addition, Table 2 below shows the products and yields according to the Examples 1 to 5.

TABLE 2

| | Primary product 3CDS (%) | Primary product 5CDS (%) | Primary product HCDS (%) | Yield of 3CDS Primary product (%) | Yield of 3CDS Secondary product (%) |
|---|---|---|---|---|---|
| Example 1 | 37.2 | — | 62.5 | 76 | 65 |
| Example 2 | 53.38 | — | 46.5 | 18 | 61 |
| Example 3 | 66.63 | — | 33.3 | 85 | 62 |
| Example 4 | 57.73 | 4.4 | 39.5 | 91 | 61 |
| Example 5 | 58.36 | — | 41.5 | 96 | 65 |

Referring to Tables 1 and 2, the method for fabricating trihalodisilane according to the Examples effectively prevented generation of other by-products (e.g., dichlorodisilane and tetrachlorodisilane) that are not easily separated from the target product (e.g., 1,1,1-trichlorodisilane), by utilizing the mixed reducing agent, and it is possible to confirm that the target product may be obtained in a high yield.

Further, as seen in Example 4, in the method for fabricating trihalodisilane according to some embodiments, it is possible to confirm that not only 1,1,1-trihalodisilane (e.g., 1,1,1-trichlorodisilane) but also pentahalodisilane (e.g., pentachlorodisilane) was fabricated as a product, by adjusting the mixed reducing agent to be used or the mixing ratio of the mixed reducing agent (e.g., the molar ratio of the first reducing agent to the second reducing agent) or the like.

Figure 5:
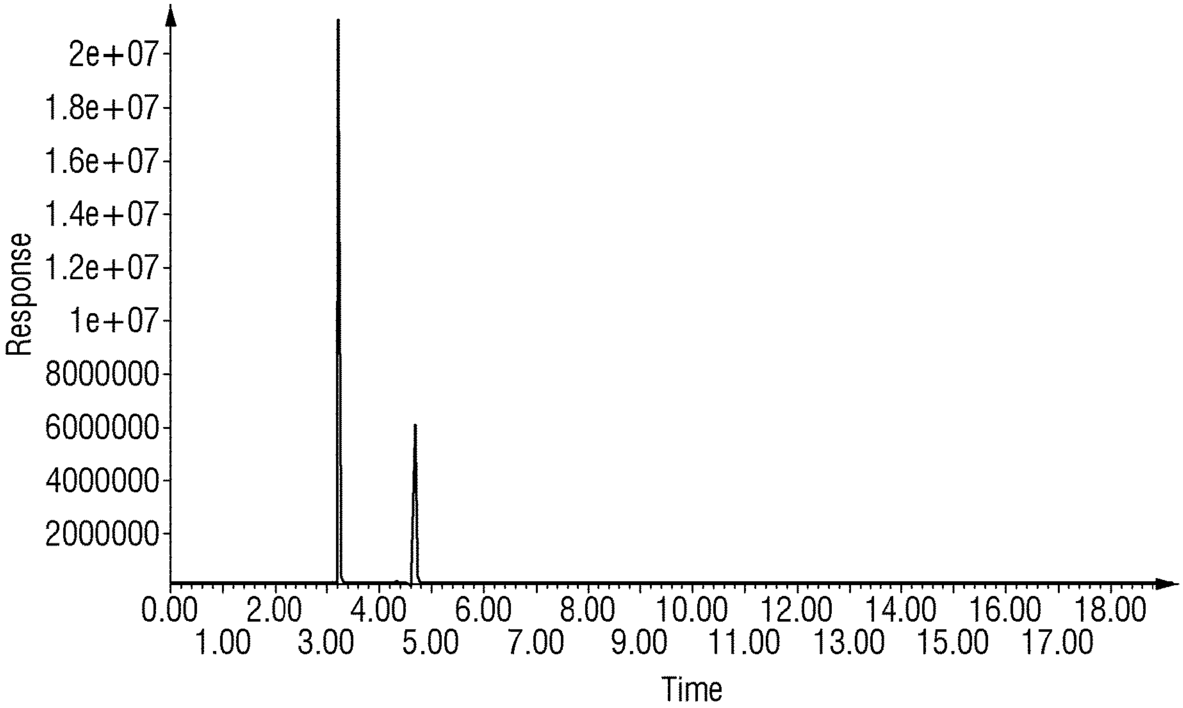
FIGS. 5 and 6 are graphs showing properties of 1,1,1-trihalodisilane fabricated using the method for fabricating trihalodisilane according to some embodiments.
Figure 6:
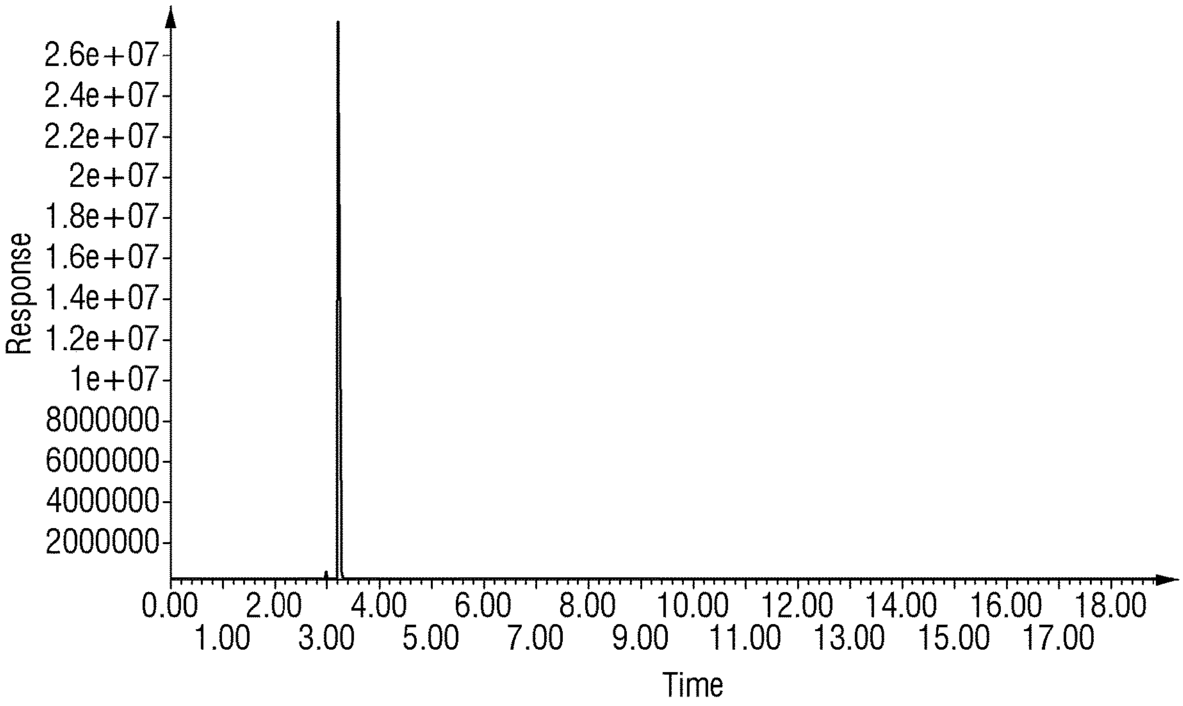

FIGS. 5 and 6 are graphs showing properties of 1,1,1-trihalodisilane fabricated using the method for fabricating trihalodisilane according to some embodiments. Specifically, FIG. 5 is a GC-TCD analysis result of the primary product fabricated according to Example 5, and FIG. 6 is a GC-TCD analysis result of the secondary product fabricated according to Example 5.

Referring to FIGS. 5 and 6, it may be seen that the method for fabricating trihalodisilane according to Example 5 provided high-purity 1,1,1-trihalodisilane, using the above-mentioned mixed reducing agent. For example, referring to FIG. 6, according to Example 5, 1,1,1-trichlorodisilane of about 99.759% was obtained as the secondary product.

Hereinafter, a method for fabricating a semiconductor device that uses the method for fabricating trihalodisilane according to the exemplary embodiments will be described referring to FIGS. 1 to 9.

Figure 7A:
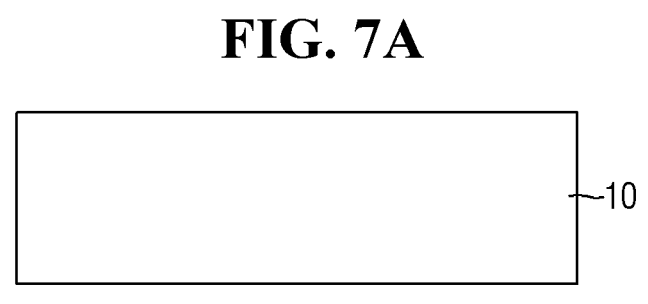
FIGS. 7A and 7B are stages in the method for fabricating the semiconductor device according to some embodiments.
Figure 7B:
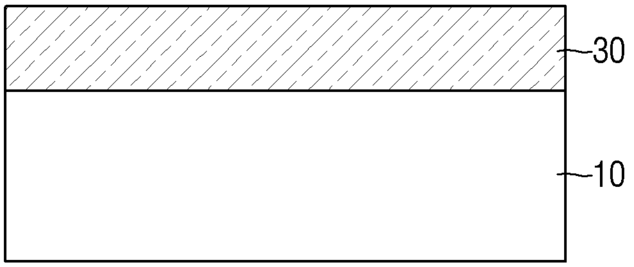

FIGS. 7A and 7B are stages in a method for fabricating the semiconductor device according to some embodiments. For convenience of explanation, repeated parts of contents explained above using FIGS. 1 to 6 may be be briefly described or omitted.

Referring to FIG. 7A, a first substrate 10 is provided.

The first substrate 10 may be bulk silicon or silicon-on-insulator (SOI). The first substrate 10 may be a silicon substrate, or may include other materials, e.g., silicon germanium, gallium arsenic, SGOI (silicon germanium on insulator), indium antimonide, lead tellurium compounds, indium arsenide, indium phosphide, gallium arsenide, or gallium antimonide. In an implementation, the first substrate 10 may be an epitaxial layer formed on the base substrate, or may be a ceramic substrate, a quartz substrate, a glass substrate for a display, or the like.

Referring to FIG. 7B, a silicon-containing layer 30 may be formed on the first substrate 10.

The silicon-containing layer 30 may include, e.g., silicon (Si) or a silicon compound such as SiGe, SiSb, SiP or SiAs. In an implementation, the silicon-containing layer 30 may include silicon or a silicon compound doped with impurities.

The silicon-containing layer 30 may be formed from a silicon precursor. In an implementation, a deposition process of forming the silicon-containing layer 30 using the silicon precursor may be performed. The deposition process may include, e.g., a chemical vapor deposition (CVD), an atomic layer deposition (ATM), a plasma-enhanced chemical vapor deposition (plasma CVD; PECVD), or a plasma-enhanced atomic layer deposition (plasma enhanced ALD; PEALD).

The silicon precursor may be provided by the method for fabricating trihalodisilane according to some embodiments, e.g., the silicon precursor may include the trihalodisilane. In an implementation, providing the silicon precursor may include providing halodisilane including at least four halogen atoms (S10 of FIG. 1), and reducing the halodisilane, using a mixed reducing agent including an aluminum reducing agent and a tin reducing agent (S20 of FIG. 1). This makes it possible to provide the silicon precursor including 1,1,1-trihalodisilane (e.g., 1,1,1-trichlorodisilane).

In an implementation, the silicon precursor may include pentahalodisilane (e.g., pentachlorodisilane) as well as 1,1,1-trihalodisilane (1,1,1-trihalodisilane). In an implementation, the silicon precursor may include both 1,1,1-trichlorodisilane and pentachlorodisilane.

In an implementation, the silicon-containing layer 30 may include an epitaxial layer that is grown from the first substrate 10.

In an implementation, the silicon-containing layer 30 may be a channel of the semiconductor device. In an implementation, the silicon-containing layer 30 may be, e.g., a channel of a volatile memory device such as a dynamic random access memory (DRAM) or as a channel of a non-volatile memory device such as a NAND flash.

Figure 8A:
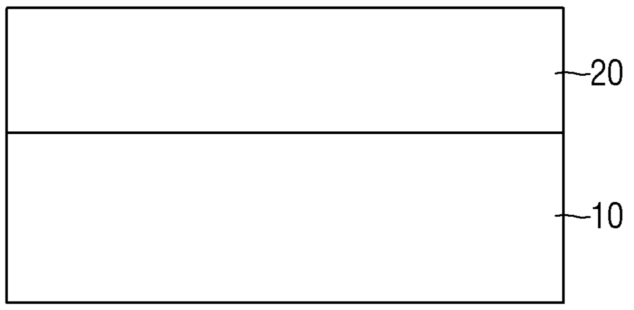
FIGS. 8A to 8C are stages in the method for fabricating the semiconductor device according to some embodiments.
Figure 8B:
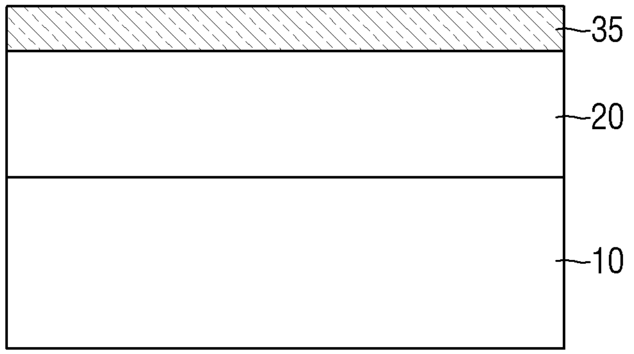
Figure 8C:
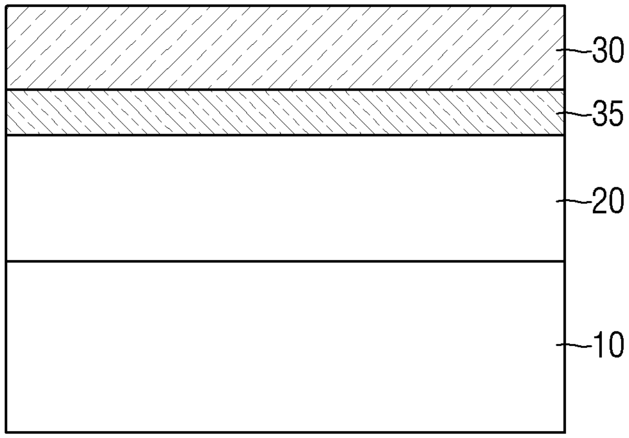

FIGS. 8A to 8C are stages in a method for fabricating the semiconductor device according to some embodiments. For convenience of explanation, repeated parts of contents explained above using FIGS. 7A and 7B may be briefly described or omitted.

Referring to FIG. 8A, a lower layer 20 may be formed on the first substrate 10.

The lower layer 20 may include, e.g., an insulating material such as silicon oxide, silicon nitride, or silicon oxynitride. In an implementation, the lower layer 20 may include a conductive material such as a metal, a metal nitride, a metal silicide, or a metal silicide nitride film, and the lower layer 20 may include a semiconductor material such as polysilicon.

Referring to FIG. 8B, a seed layer 35 may be formed on the lower layer 20.

In an implementation, a deposition process of forming the seed layer 35 using the silicon precursor may be performed.

Referring to FIG. 8C, the silicon-containing layer 30 may be formed on the seed layer 35.

The seed layer 35 may function as a seed for forming the silicon-containing layer 30 on the lower layer 20. The silicon-containing layer 30 may include an epitaxial layer that is grown from the seed layer 35.

Figure 9A:
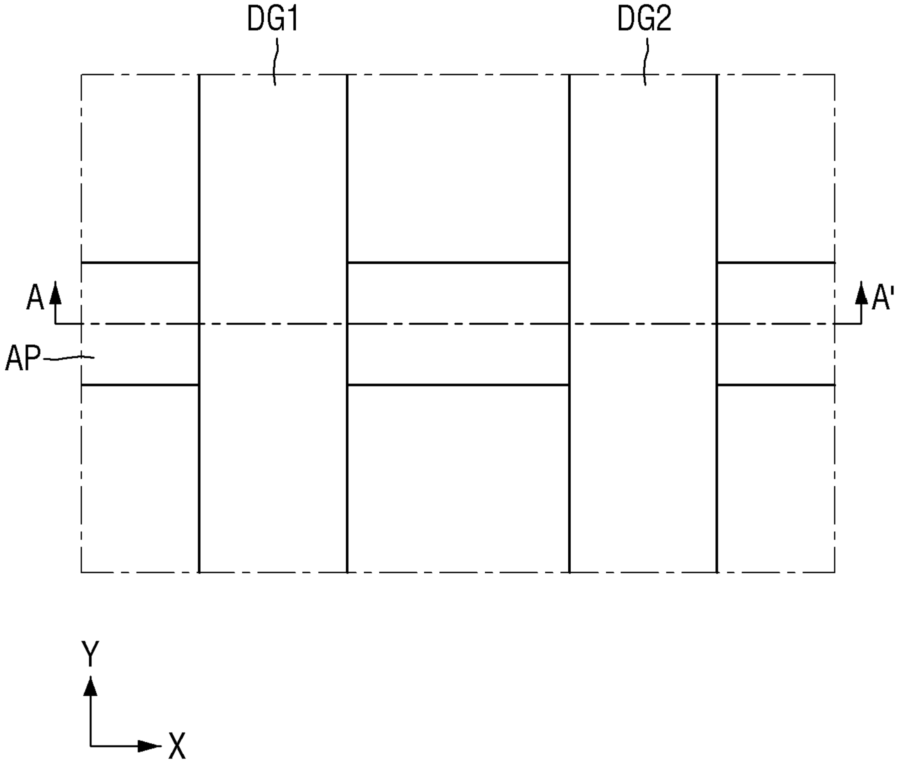
FIGS. 9A to 9E are stages in a method for fabricating a semiconductor device according to some embodiments.
Figure 9B:
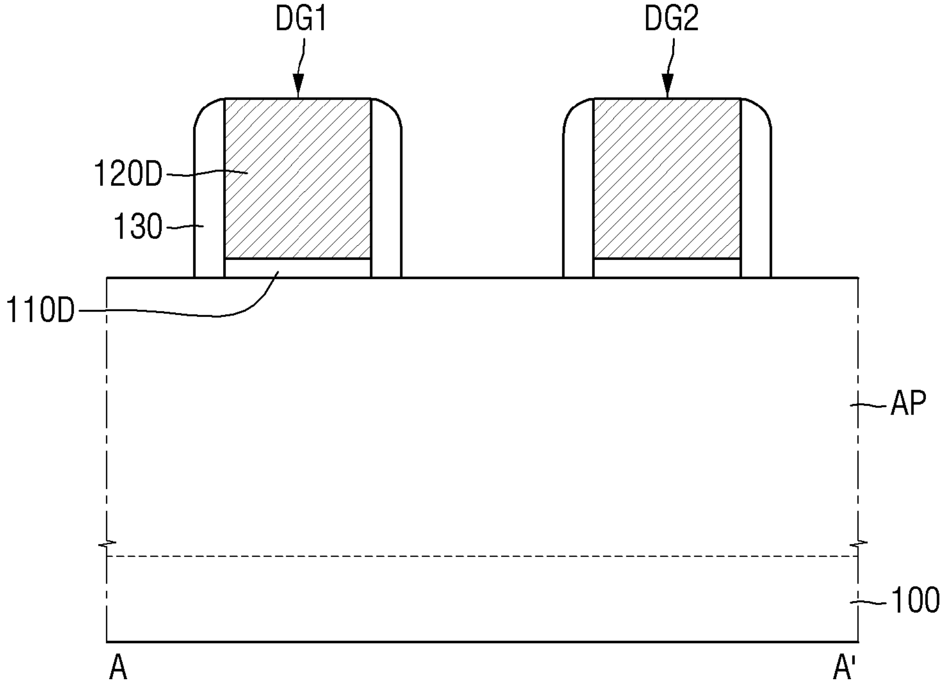

FIGS. 9A to 9E are stages in a method for fabricating a semiconductor device according to some embodiments. For convenience of explanation, repeated parts of contents explained above using FIGS. 7A to 8C may be briefly described or omitted. For reference, FIG. 9B is a cross-sectional view taken along A-A' of FIG. 9A.

Referring to FIGS. 9A and 9B, an active pattern AP, a first dummy gate structure DG1 and a second dummy gate structure DG2 may be formed on the second substrate 100.

The second substrate 100 may include bulk silicon or silicon-on-insulator (SOI). The second substrate 100 may be a silicon substrate, or may include other materials, e.g., silicon germanium, gallium arsenic, SGOI (silicon germanium on insulator), indium antimonide, lead tellurium compounds, indium arsenide, indium phosphide, gallium arsenide, or gallium antimonide. In an implementation, the second substrate 100 may be an epitaxial layer formed on the base substrate, or may be a ceramic substrate, a quartz substrate, a glass substrate for a display, or the like.

The active pattern AP may be formed on the second substrate 100. The active pattern AP may extend (e.g., lengthwise) in a first direction X. The active pattern AP may be a part of the second substrate 100, or may include an epitaxial layer that is grown from the second substrate 100.

The active pattern AP may include, e.g., silicon (Si) or germanium (Ge), which is an elemental semiconductor material. In an implementation, the active pattern AP may include a compound semiconductor, e.g., a group IV-IV compound semiconductor or a group III-v compound semiconductor. In the following description, the active pattern AP will be described as a silicon fin type pattern including silicon.

The first dummy gate structure DG1 and the second dummy gate structure DG2 may be formed on the second substrate 100 and the active pattern AP. The first dummy gate structure DG1 and the second dummy gate structure DG2 may each extend (e.g., lengthwise) in a second direction Y that intersects the first direction X. The first dummy gate structure DG1 and the second dummy gate structure DG2 may each include a dummy gate dielectric film 110D, a dummy gate electrode 120D, and a gate spacer 130.

The dummy gate dielectric film 110D and the dummy gate electrode 120D may be sequentially stacked on the second substrate 100 and the active pattern AP. In an implementation, an insulating film and a conductive film may be sequentially formed on the second substrate 100 and the active pattern AP. Subsequently, a patterning process of patterning the insulating film and the conductive film may be performed. As a result, the dummy gate dielectric film 110D and the dummy gate electrode 120D extending in the second direction Y may be formed.

The gate spacer 130 may extend along the side surfaces of the dummy gate dielectric film 110D and the side surfaces of the dummy gate electrode 120D. The gate spacer 130 may include an insulating material, e.g., silicon nitride (SiN), silicon oxynitride (SiON), silicon oxide ($SiO_2$), silicon oxycarbonitride (SiOCN), or combinations thereof.

Figure 9C:
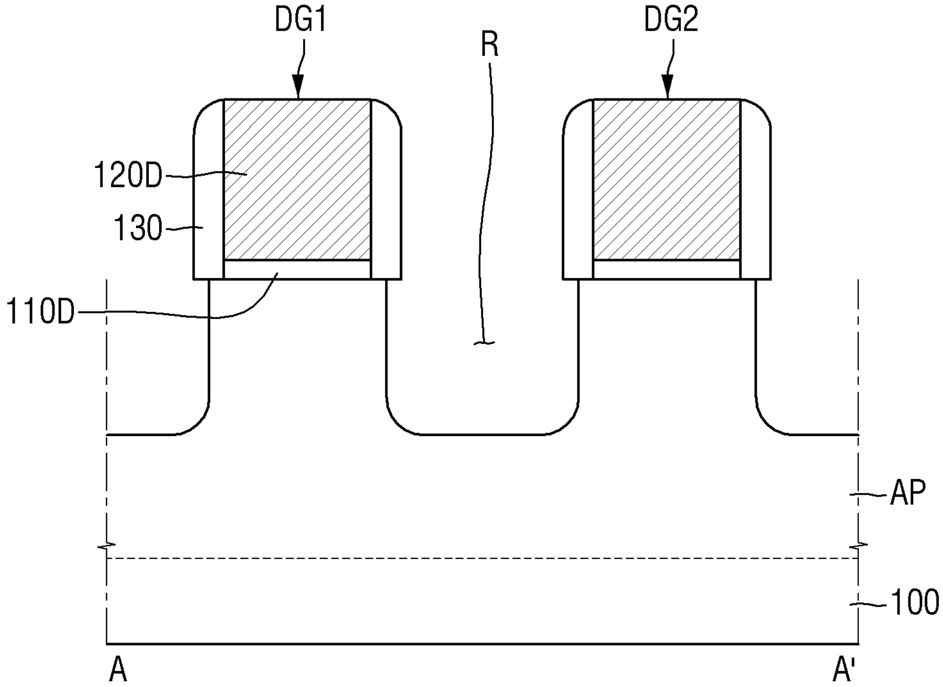

Referring to FIG. 9C, a recess R may be formed inside the active pattern AP.

The recess R may be formed by an etching process that uses the first dummy gate structure DG1 and the second dummy gate structure DG2 as an etching mask. The etching process may include, e.g., a reactive ion etching (RIE) process or a wet etching process. As a result, the recess R adjacent to the side surfaces of the first dummy gate structure DG1 and the side surfaces of the second dummy gate structure DG2 may be formed in the active pattern AP.

In an implementation, the recess R may include an undercut that is formed at a lower end of the gate spacer 130.

Figure 9D:
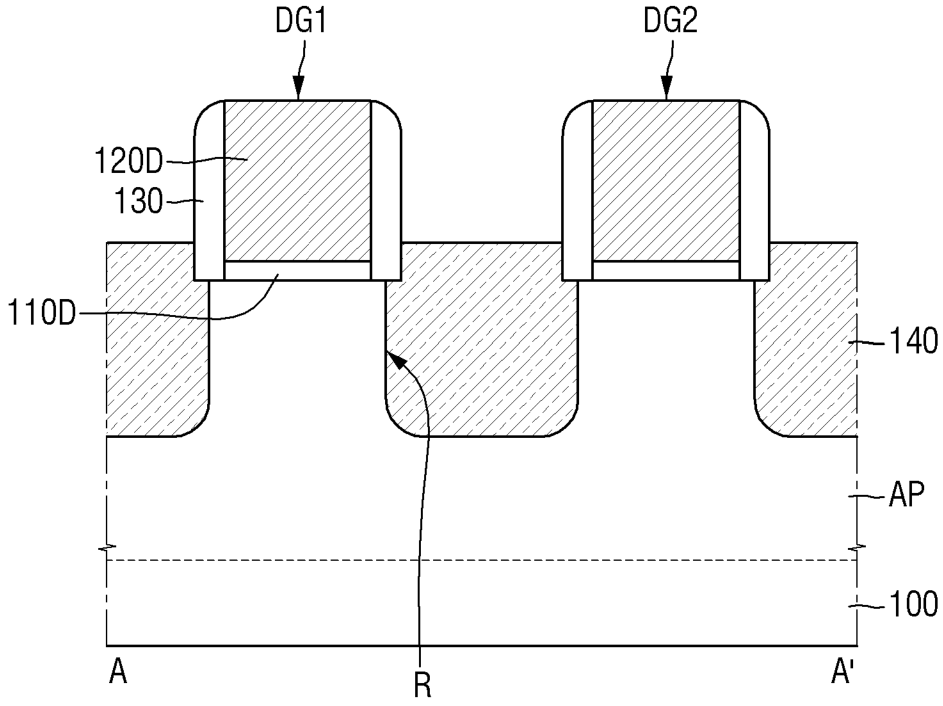

Referring to FIG. 9D, a source/drain region 140 may be formed inside the recess R.

The source/drain region 140 may include silicon (Si) or a silicon compound such as SiGe, SiSb, SiP, or SiAs. In an implementation, the source/drain region 140 may include impurity-doped silicon or a silicon compound.

The source/drain region 140 may be formed from the silicon precursor. In an implementation, an epitaxial growth process of forming the source/drain region 140 using the silicon precursor may be performed. In an implementation, the source/drain region 140 may be formed by a doping process that is performed in situ with the epitaxial growth process.

The silicon precursor may be provided by the method for fabricating trihalodisilane according to some embodiments. In an implementation, providing the silicon precursor may include providing halodisilane including at least four halogen atoms (S10 of FIG. 1), and reducing the halodisilane using a mixed reducing agent including an aluminum reducing agent and a tin reducing agent (S20 of FIG. 1). This makes it possible to provide the silicon precursor including 1,1,1-trihalodisilane (e.g., 1,1,1-trichlorodisilane).

In an implementation, the silicon precursor may include pentahalodisilane (e.g., pentachlorodisilane) as well as 1,1,1-trihalodisilane. In an implementation, the silicon precursor may include both 1,1,1-trichlorodisilane and pentachlorodisilane.

In an implementation, the source/drain region 140 may be an elevated source/drain region. In an implementation, the uppermost part of the source/drain region 140 may protrude upward from the uppermost surface of the active pattern AP.

Figure 9E:
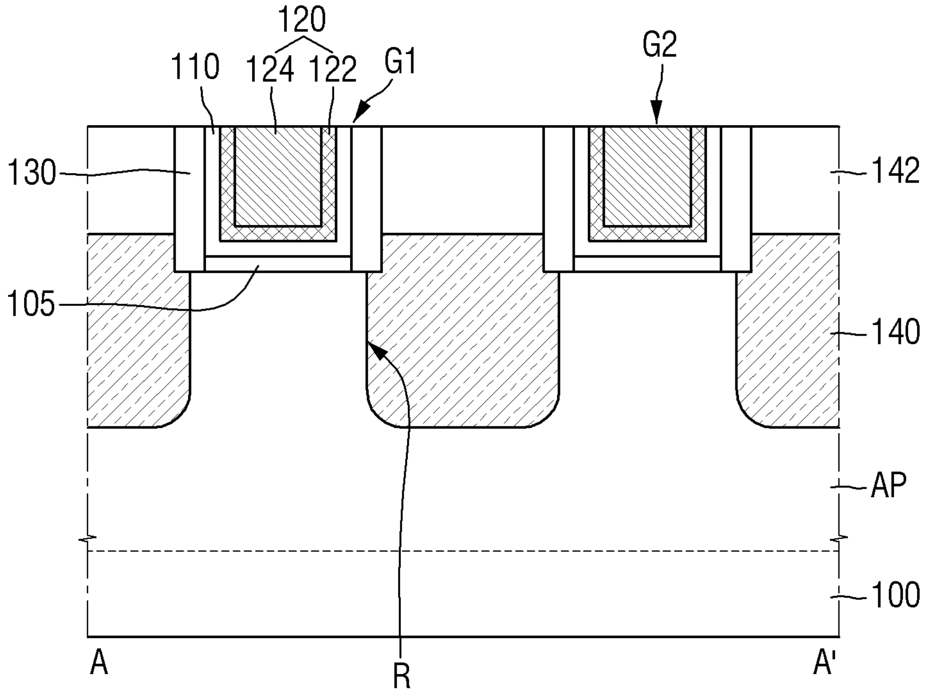

Referring to FIG. 9E, a first gate structure G1 and a second gate structure G2 may be formed.

The first gate structure G1 and the second gate structure G2 may be formed by a replacement process. In an implementation, an interlayer insulating film 142 that covers the second substrate 100, the active pattern AP, the source/drain region 140, the first dummy gate structure DG1 and the second dummy gate structure DG2 may be formed. After that, the dummy gate dielectric film 110D and the dummy gate electrode 120D may be removed. Subsequently, the gate dielectric film 110 and the gate electrode 120 may be formed inside the region from which the dummy gate dielectric film 110D and the dummy gate electrode 120D are removed. Therefore, the first gate structure G1 and the second gate structure G2 including the gate dielectric film 110, the gate electrode 120 and the gate spacer 130 may be formed.

In an implementation, an interface film 105 may be formed before formation of the gate dielectric film 110. Therefore, the interface film 105 may be between the active pattern AP and the gate dielectric film 110. In an implementation, the interface film 105 may include, e.g., silicon oxide. In an implementation, the interface film 105 may be omitted.

The gate dielectric film 110 may include a dielectric material, e.g., silicon oxide, silicon oxynitride, silicon nitride, or a high dielectric constant material having a higher dielectric constant than silicon oxide. The high dielectric constant material may include, e.g., hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, lead zinc niobate, or combinations thereof.

The gate electrode 120 may include a conductive material, e.g., TiN, WN, TaN, Ru, TiC, TaC, Ti, Ag, Al, TiAl, TiAlN, TiAlC, TaCN, TaSiN, Mn, Zr, W, Al, or combinations thereof.

In an implementation, the gate electrode 120 may include a work function adjusting film 122 that adjusts the work function, and a filling conductive film 124 which fills a space that remains after formation of the work function adjusting film 122. The work function control film 122 may include, e.g., TiN, TaN, TiC, TaC, TiAlC, or combinations thereof. The filling conductive film 124 may include, e.g., W or Al.

A fin-type field effect transistor (FinFET) including a channel region of a fin-type pattern has been described as the semiconductor device according to some embodiments. As another example, the semiconductor device may include MBCFETR including multi-bridge channel, a tunneling field effect transistor (tunneling FET), a vertical field effect transistor (vertical FET; VFET), a CFET (Complementary FET) or the like. Alternatively, the semiconductor device may include a bipolar junction transistor, a laterally diffused metal oxide semiconductor (LDMOS), and the like.

By way of summation and review, in some methods of fabricating trihalodisilane, large amounts of by-products (e.g., dihalodisilane, tetrahalodisilane, or pentahalodisilane) as well as trihalodisilane may be generated as products, and especially, dihalodisilane and tetrahalodisilane among the by-products to be generated may not easily be separated from trihalodisilane, which is a target product.

One or more embodiments may provide a method for fabricating trihalodisilane, which may have a high yield and may be easily separated from the by-product.

One or more embodiments may provide a method for fabricating trihalodisilane using a reducing agent.

One or more embodiments may provide a method for fabricating a semiconductor device having improved productivity, using the method for fabricating trihalodisilane which has a high yield and is easily separated from by-product.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method for fabricating trihalodisilane, the method comprising:

providing a halodisilane including at least four halogen atoms;

reducing the halodisilane, using a mixed reducing agent including a first reducing agent represented by following Chemical Formula 1-1 and a second reducing agent represented by following Chemical Formula 2-1, wherein the reducing does not include the use of a solvent other than the first reducing agent and the second reducing agent; and obtaining a product including a 1,1,1-trihalodisilane,

[Chemical Formula 1-1]

$$(R_A)_m—Al—H_n$$

wherein, in Chemical Formula 1-1, $R_A$ is an alkyl group, and m and n are each independently 1 or 2, and m+n=3,

[Chemical Formula 2-1]

$$(R_S)_p—Sn—H_q$$

wherein, in Chemical Formula 2-1, $R_S$ is an alkyl group or an aryl group, p and q are each independently 1, 2, or 3, and p+q=4.

2. The method for fabricating trihalodisilane as claimed in claim 1, wherein, in Chemical Formula 1-1, m is 2 and n is 1.

3. The method for fabricating trihalodisilane as claimed in claim 2, wherein the first reducing agent includes diisobutylaluminum hydride.

4. The method for fabricating trihalodisilane as claimed in claim 1, wherein, in Chemical Formula 2-1, p is 3 and q is 1.

5. The method for fabricating trihalodisilane as claimed in claim 4, wherein the second reducing agent includes tri-n-butyltin hydride or triphenyltin hydride.

6. The method for fabricating trihalodisilane as claimed in claim 1, wherein the product further includes a pentahalodisilane.

7. The method for fabricating trihalodisilane as claimed in claim 1, wherein a molar ratio of the first reducing agent to the second reducing agent is 9:1 to 1:9.

8. The method for fabricating trihalodisilane as claimed in claim 7, wherein the molar ratio of the first reducing agent to the second reducing agent is 9:1 to 5:5.

9. A method for fabricating trihalodisilane, the method comprising:

providing a halodisilane including at least four halogen atoms;

cooling the halodisilane to a first temperature that is higher than a freezing point of the halodisilane and lower than 15° C.;

mixing the cooled halodisilane with a mixed reducing agent including an aluminum reducing agent and a tin reducing agent to generate a mixture;

stirring the mixture at a second temperature that is higher than the first temperature; and separating a 1,1,1-trihalodisilane from the mixture, wherein the method does not include the use of a solvent other than the aluminum reducing agent and the tin reducing agent.

10. The method for fabricating trihalodisilane as claimed in claim 9, wherein:

a halogen atom of the at least four halogen atoms includes a chlorine atom, and the 1,1,1-trihalodisilane includes 1,1,1-trichlorodisilane.

11. The method for fabricating trihalodisilane as claimed in claim 9, wherein:

the aluminum reducing agent is represented by following Chemical Formula 1-1, the tin reducing agent includes tri-n-butyltin hydride or triphenyltin hydride,

[Chemical Formula 1-1]

$$(R_A)_m—Al—H_n$$

in Chemical Formula 1-1, $R_A$ is an alkyl group, and m and n are each independently 1 or 2, and m+n=3.

12. The method for fabricating trihalodisilane as claimed in claim 9, wherein the first temperature is 10° C. or lower.

13. The method for fabricating trihalodisilane as claimed in claim 9, wherein the second temperature is 15° C. to 25° C.

14. The method for fabricating trihalodisilane as claimed in claim 9, further comprising cooling the mixture to a third temperature prior to stirring the mixture at the second temperature, the third temperature being lower than the first temperature.

15. The method for fabricating trihalodisilane as claimed in claim 14, wherein the third temperature is 0° C. or lower.

16. The method for fabricating trihalodisilane as claimed in claim 9, wherein separating the 1,1,1-trihalodisilane from the mixture includes:

cooling the mixture to a third temperature that is lower than the first temperature to obtain a solid crude product, and separating the 1,1,1-trihalodisilane from the solid crude product.

17. The method for fabricating trihalodisilane as claimed in claim 16, wherein the third temperature is −70° C. or lower.

18. The method for fabricating trihalodisilane as claimed in claim 16, wherein separating the 1,1,1-trihalodisilane from the solid crude product includes performing a reduced pressure fractional distillation.

19. A method for fabricating a semiconductor device, the method comprising:

providing a substrate; and forming a silicon-containing layer on the substrate by providing a silicon precursor including a 1,1,1-trihalodisilane, wherein providing the silicon precursor includes:

providing a halodisilane including at least four halogen atoms, and reducing the halodisilane using a mixed reducing agent including an aluminum reducing agent and a tin reducing agent, wherein reducing the halodisilane does not include the use of a solvent other than the aluminum reducing agent and the tin reducing agent.

20. The method for fabricating the semiconductor device as claimed in claim 19, wherein:

the aluminum reducing agent is represented by following Chemical Formula 1-1, the tin reducing agent includes tri-n-butyltin hydride or triphenyltin hydride,

[Chemical Formula 1-1]

$$(R_A)_m—Al—H_n$$

in Chemical Formula 1-1, $R_A$ is an alkyl group, and m and n are each independently 1 or 2, and m+n=3.

* * * * *